United States Patent
Iijima et al.

(10) Patent No.: US 9,018,636 B2
(45) Date of Patent: Apr. 28, 2015

(54) SEMICONDUCTOR DEVICE HAVING A PLURALITY OF TRANSISTORS WITH DIFFERENT CRYSTAL FACE

(71) Applicant: Kabushiki Kaisha Toshiba, Tokyo (JP)

(72) Inventors: Ryosuke Iijima, Tokyo (JP); Yukio Nakabayashi, Kanagawa-ken (JP); Takashi Shinohe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 13/782,318

(22) Filed: Mar. 1, 2013

(65) Prior Publication Data

US 2014/0034964 A1 Feb. 6, 2014

(30) Foreign Application Priority Data

Jul. 31, 2012 (JP) ................................. 2012-170280

(51) Int. Cl.
*H01L 29/04* (2006.01)
*H01L 21/02* (2006.01)
(Continued)

(52) U.S. Cl.
CPC ........ *H01L 29/045* (2013.01); *H01L 21/02433* (2013.01); *H01L 21/8238* (2013.01); *H01L 27/092* (2013.01); *H01L 27/0924* (2013.01); *H01L 29/0657* (2013.01); *H01L 29/1608* (2013.01); *H01L 21/8213* (2013.01); *H01L 27/0605* (2013.01)

(58) Field of Classification Search
CPC ..................... H01L 21/02433; H01L 21/8238; H01L 29/045
USPC ......................................................... 257/351
See application file for complete search history.

(56) References Cited

U.S. PATENT DOCUMENTS

| 7,319,258 B2 * | 1/2008 | Yang et al. ..................... 257/347 |
| 2005/0167750 A1 * | 8/2005 | Yang et al. ..................... 257/347 |

(Continued)

FOREIGN PATENT DOCUMENTS

| JP | 07-131016 A | 5/1995 |
| JP | 2005-244180 | 9/2005 |

(Continued)

OTHER PUBLICATIONS

R. Kosugi, et al., "Fabrication of double implanted (0001) 4H-SiC MOSFETs by using pyrogenic re-oxidation annealing", Materials Science Forum, vols. 457-460, 2004, pp. 1397-1400.

(Continued)

*Primary Examiner* — Phat X Cao
(74) *Attorney, Agent, or Firm* — Oblon, McClelland, Maier & Neustadt, L.L.P.

(57) ABSTRACT

According to one embodiment, a semiconductor device includes a first and a second transistor. The first transistor includes a first and a second region of a first conductivity type and a third region of a second conductivity type. The first region is disposed along a first crystal face of a silicon carbide region. The silicon carbide region has the first crystal face and a second crystal face. The second and the third region are disposed along the first face. The third region is provided between the first and the second region. The second transistor includes a fourth and fifth region of the second type and a sixth region of the first type. The fourth, the fifth and the sixth region are disposed along the second face of the silicon carbide region. The sixth region is provided between the fourth and the fifth region.

17 Claims, 9 Drawing Sheets (51) Int. Cl.
*H01L 21/8238* (2006.01)
*H01L 27/092* (2006.01)
*H01L 29/06* (2006.01)
*H01L 21/82* (2006.01)
*H01L 27/06* (2006.01)
*H01L 29/16* (2006.01)

(56) References Cited

U.S. PATENT DOCUMENTS

2007/0099353 A1    5/2007    Thean et al.
2008/0203400 A1*   8/2008    Fukuda et al. .................. 257/77

FOREIGN PATENT DOCUMENTS

JP      2009-514247 A      4/2009
WO    WO 2011/047244 A2   4/2011

OTHER PUBLICATIONS

"Piezoresistance physical properties of the Single Crystal of Silicon Carbide", Japan Society for Molecular Science Solid Phase, 2010, 2 pages.

Office Action issued Jul. 15, 2014 in Japanese Patent Application No. 2012-170280 (with English language translation).

* cited by examiner

SEMICONDUCTOR DEVICE HAVING A PLURALITY OF TRANSISTORS WITH DIFFERENT CRYSTAL FACE

CROSS-REFERENCE TO RELATED APPLICATIONS

This application is based upon and claims the benefit of priority from the prior Japanese Patent Application No. 2012-170280, filed on Jul. 31, 2012; the entire contents of which are incorporated herein by reference.

FIELD

Embodiments described herein relate generally to a semiconductor device.

BACKGROUND

Silicon carbide (SiC) has excellent physical properties exhibiting 3 times the band gap, approximately 10 times the breakdown field strength, and approximately 3 times the thermal conductivity compared to silicon (Si). Utilizing these properties of SiC allows a semiconductor device having excellent low-loss and high temperature operation to be realized.

A semiconductor device in which such SiC is used may also be considered for a configuration that has embedded transistors of different conductivity types (for example, a complementary metal oxide semiconductor (CMOS)).

Improvement in different switching characteristics is important in a semiconductor device that uses SiC.

DETAILED DESCRIPTION

In general, according to one embodiment, a semiconductor device includes a first transistor and a second transistor. The first transistor includes a first region of a first conductivity type, a second region of the first conductivity type and a third region of a second conductivity type. The first region is disposed along a first crystal face of a silicon carbide region. The silicon carbide region has the first crystal face and a second crystal face having a different plane orientation from the plane orientation of the first crystal face. The second region is disposed along the first crystal face. The third region is provided between the first region and the second region. The third region is disposed along the first crystal face. The second transistor includes a fourth region of the second conductivity type, a fifth region of the second conductivity type and a sixth region of the first conductivity type. The fourth region is disposed along the second crystal face of the silicon carbide region. The fifth region is disposed along the second crystal face. The sixth region is provided between the fourth region and the fifth region. The sixth region is disposed along the second crystal face.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to constituents that have already appeared in the drawings and have been described, and repetitious detailed descriptions of such constituents are omitted.

Further, in the following description, the + and − symbols attached to the notations of n and p indicating the n-type and p-type conductive types show relative high and low impurity concentrations in the conductivity types respectively.

Further, in the following description, planes offset in a range of 8 degrees to the crystal face are included in the plane orientation illustrating the crystal face.

First Embodiment

Figure 1A:
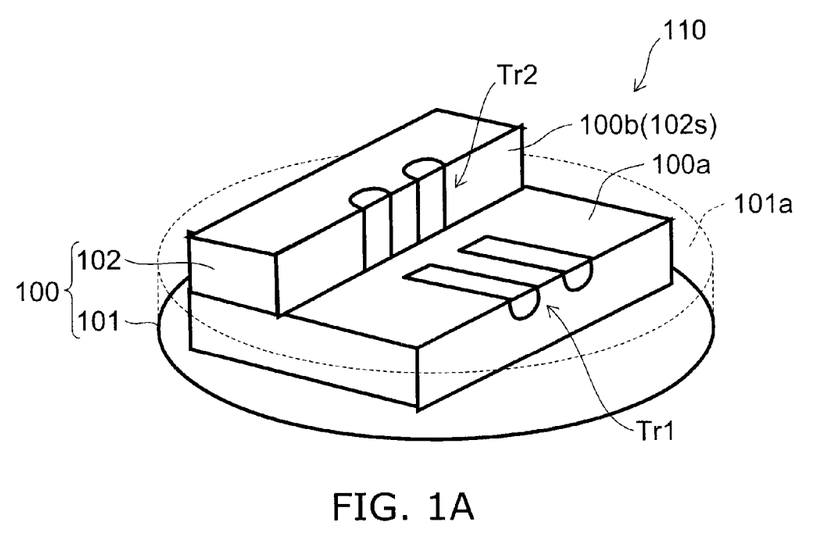
FIGS. 1A and 1B are schematic views illustrating examples of configurations of a semiconductor device according to a first embodiment.
Figure 1B:
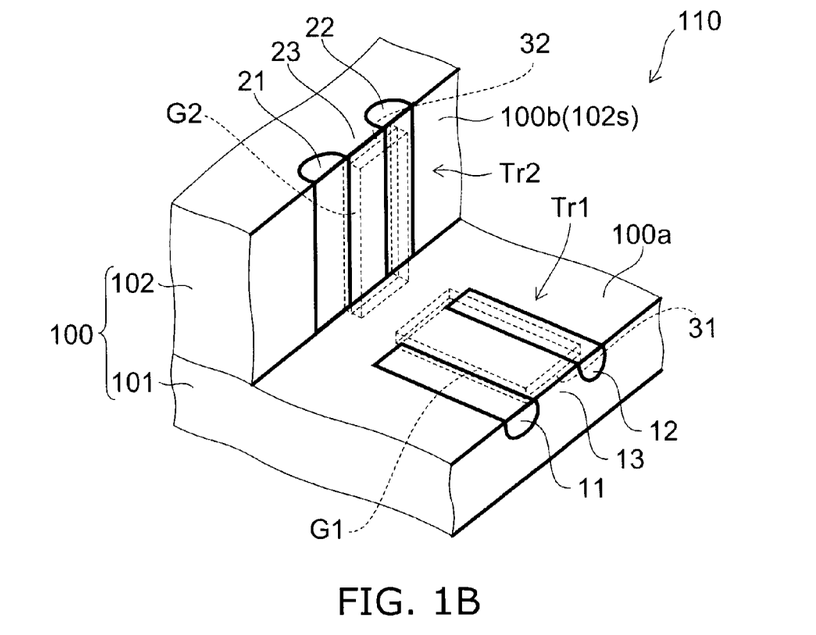

FIGS. 1A and 1B are schematic views illustrating examples of configurations of a semiconductor device according to a first embodiment.

FIG. 1A illustrates a schematic perspective view of a semiconductor device 110, and FIG. 1B schematically illustrates a layout of a transistor region. Note that the broken line shown in FIG. 1A shows a state prior to removing (etching or the like) a surface 101a of an SiC wafer 101.

As illustrated in FIG. 1A, the semiconductor device 110 according to the first embodiment is provided with a first field effect transistor (first transistor) Tr1 provided on a silicon carbide region 100 and a second field effect transistor (second transistor) Tr2 provided on the silicon carbide region 100.

The silicon carbide region 100 has a first crystal face 100a and a second crystal face 100b. The silicon carbide region 100 includes for example, an SiC wafer (substrate) 101 and a crystal layer 102 provided on the SiC wafer 101.

The polytype of the silicon carbide region 100 is 4H. In other words, the silicon carbide region 100 is a 4H-SiC. In the embodiment, a surface (first face) 101a of the SiC wafer 101 is a (000-1) face (C face). The first crystal face 100a is one of the crystal face of the 4H-SiC crystal faces which are the silicon carbide region 100. The first crystal face 100a is the surface 101A of, for example, the SiC wafer 101. In other words, the first crystal face 100a is, for example, the (000-1) face of the 4H-SiC. Note that the first crystal face 100a may be a surface of a layer of crystal that has grown on the surface 101a of the SiC wafer 101.

The second crystal face 100b has a different plane orientation from the plane orientation of the first crystal face 100a.

The second crystal face 100b in the embodiment is a face that is orthogonal to the first crystal face 100a. The second crystal face 100b is, for example, a (11-20) face (a face). In the embodiment, the second crystal face 100b is a side face (second base) 102s of, for example, the crystal layer 102. Note that the second crystal face 100b may be a face equivalent to the (11-20) face (a face).

As illustrated in FIG. 1B, a first field effect transistor Tr1 has an n-type (first conductivity type in the embodiment) source region (first region) 11, an n-type drain region (second region) 12, a p-type (second conductivity type in the embodiment) channel region (third region) 13 provided between the source region 11 and the drain region 12. Here, the source region 11, the drain region 12, and the channel region 13 are disposed along the first crystal face 100a.

A first gate insulating film (first insulating film) 31 is provided on top of the channel region 13, and a first gate electrode (first electrode) G1 is provided on top of the first gate insulating film 31. The first field effect transistor Tr1, when ON state, forms an n-type channel in the channel region 13. In other words, the first field effect transistor Tr1 is an n-channel metal oxide semiconductor field effect transistor (MOSFET). Note that in the first field effect transistor Tr1, the channel is formed along the first crystal face 100a. The first field effect transistor Tr1 may be formed in plurality on the first crystal face 100a.

A second field effect transistor Tr2 has a p-type source region (fourth region) 21, a p-type (second conductivity type) drain region (fifth region) 22, and an n-type channel region (sixth region) 23 provided between the source region 21 and the drain region 22. The source region 21, the drain region 22, and the channel region 23 are disposed along the second crystal face 100b.

A second gate insulating film (second insulating film) 32 is provided on top of the channel region 23 and a second gate electrode (second electrode) G2 is provided on top of the second gate insulating film 32. The second field effect transistor Tr2, when ON state, forms a p-type channel in the channel region 23. In other words, the second field effect transistor Tr2 is a p-type MOSFET. Note that in the second field effect transistor Tr2, the channel is formed along the second crystal face 100b. The second field effect transistor Tr2 may be formed in plurality on the second crystal face 100b.

In this manner, with the semiconductor device 110, transistors having conductivity types appropriate to the respective crystal face is provided for different crystal faces (first crystal face 100a and second crystal face 100b) of the silicon carbide region 100. In the semiconductor device 110, an n-channel MOSFET (first field effect transistor Tr1) in which a channel is formed along the first crystal face 100a is provided and a p-channel MOSFET (second field effect transistor Tr2) in which a channel is formed along the second crystal face 100b is provided. Disposing transistors having a conductivity type appropriate to the respective crystal face allows a sufficient level of performance to be achieved by the transistors having respective conductivity types in the semiconductor device 110 in which SiC is used.

A description will be given here of a relationship between a crystal face and the characteristics of a transistor according to conductivity type.

Figure 2:
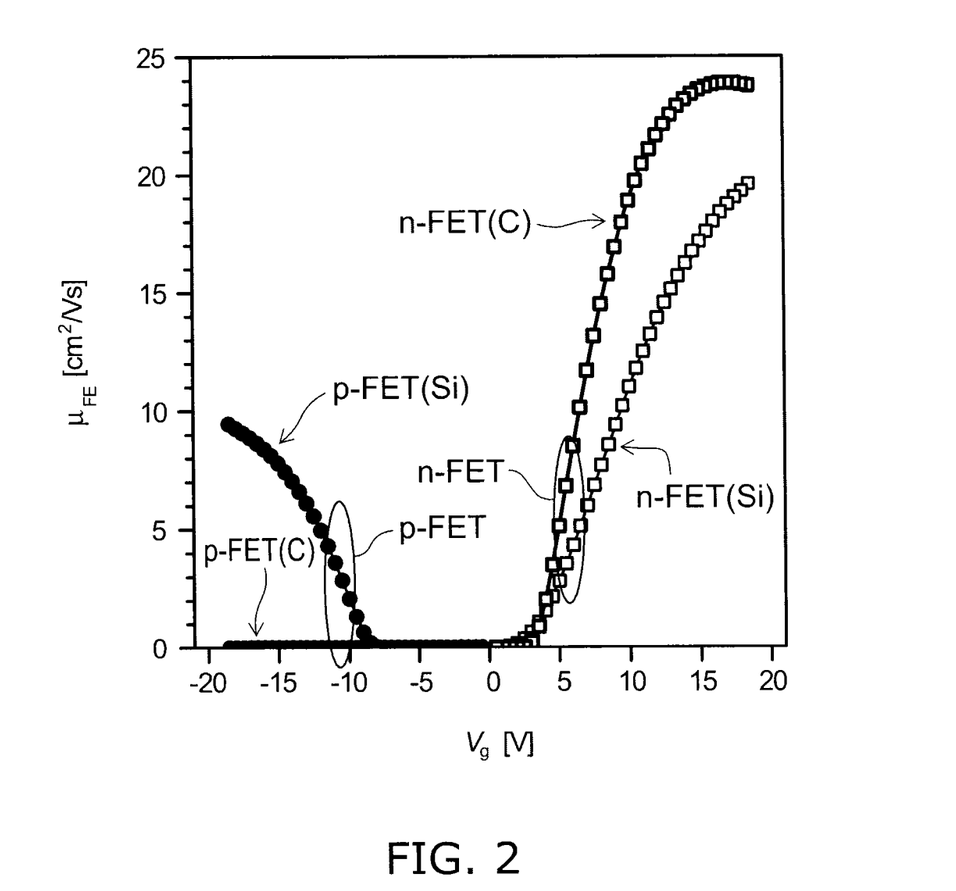
FIG. 2 is a diagram illustrating a relationship between gate voltage and carrier mobility.

FIG. 2 is a diagram illustrating a relationship between gate voltage Vg (V) and carrier mobility μFE (cm2/Vs).

FIG. 2 illustrates the gate voltage dependence of carrier mobility for each of an n-channel MOSFET (hereinafter referred to as "n-FET (Si)") formed along the (0001) face (Si face), an n-channel MOSFET (hereinafter referred to as "n-FET (C)") formed along the (000-1) face (C face), a p-channel MOSFET (hereinafter referred to as "p-FET (Si)") formed along the (0001) face (Si face), and a p-channel MOSFET (hereinafter referred to as "p-FET (C)") formed along the (000-1) face (C face) respectively on a 4H-SiC substrate.

First, a description will be given of the mobility of the n-channel MOSFET (hereinafter referred to as "n-FET"). As shown in FIG. 2, it can be understood that the mobility of the n-FET (C) is higher than the mobility of the n-FET (Si).

Next, a description will be given of the mobility of the p-channel MOSFET (hereinafter referred to as "p-FET"). As shown in FIG. 2, the n-FET (C) remains OFF state irrespective of the gate voltage without switching. Therefore, the mobility of the n-FET (C) is zero.

Meanwhile, although the p-FET (Si) switches, the mobility thereof is smaller than the mobility of the n-FET (Si) formed along the same (0001) face (Si face).

The result from this leads to the assumptions (1) and (2) given below for forming a device using transistors having different conductivity types on a 4H-SiC substrate. Note that the example given here is that of forming a CMOS device.

(1) ... Not suited to forming a CMOS device along the (000-1) face (C face). This is because the p-FET (C) formed along the (000-1) face (C face) does not operate normally. Therefore, in order to form a CMOS on an SiC substrate where the (000-1) (C face) face is the surface requires a technique for disposing the p-FET onto a crystal face other than the (000-1) face (C face).

For example, there is a report that the p-FET operates on the (11-20) face that is orthogonal to the (000-1) face (C face) (see for example, M. Noborio et al., IEEE trans. Electron Devices, vol. 56, no. 9, pp. 1953-1958, September 2009). Accordingly, providing a p-FET along on the (11-20) face is one solution.

(2) ... While a CMOS device created along the (0001) face (Si face) will operate, disposing one of an n-FET (Si) or a p-FET (Si) on another crystal face provides at least one advantage of either high performance or high integration.

For example, there is a report in which the carrier mobility of an n-FET, when formed on the (11-20) face, is higher than when formed on the (0001) face (Si face) (see for example, M. Noborio et al., IEEE trans. Electron Devices, vol. 56, no. 9, pp. 1953-1958, September 2009). Accordingly, providing an n-FET on the (11-20) face and providing a p-FET on the (0001) face (Si face) improve the operating speed of the CMOS.

Also, a similar effect is provided by providing an n-FET on the (000-1) face (C face) and providing a p-FET on the (0001) face (Si face).

In the semiconductor device 110 according to the embodiment, transistor characteristics of respective conductivity types can be sufficiently demonstrated by using the relationship between the crystal face of the SiC and the characteristics of an n-FET and a p-FET as described above. In other words, in the semiconductor device 110, the n-FET, which is the first field effect transistor Tr1, is provided along (000-1) face which is the first crystal face 100a, and the p-FET, which is the second field effect transistor Tr2, is provided along (11-20) face which is the second crystal face 100b. By this, the characteristics of the semiconductor device 110 are improved when providing transistors having different conductivity types when using SiC.

In addition, the integration level of a CMOS circuit is improved when providing the p-FET on the (11-20) face. The p-FET has lower carrier mobility then the n-FET. Therefore, the channel width of the p-FET is preferred to be wider than the channel width of the n-FET. As with the semiconductor device 110 according to the embodiment, providing the p-FET on the (11-20) face that is orthogonal to the surface 101a of the SiC wafer 101 makes the direction of the channel width of the p-FET to be orthogonal to the surface 101a. Accordingly, the occupied area of an entire CMOS is reduced compared to the case when the direction of the channel width of the p-FET is in the direction along the surface 101a.

Figure 3A:
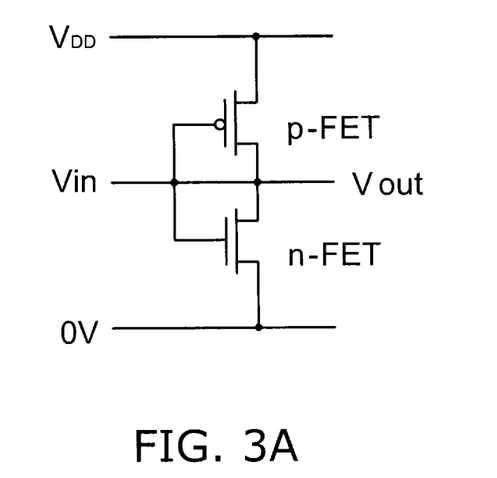
FIGS. 3A and 3B are diagrams illustrating a CMOS inverter.
Figure 3B:
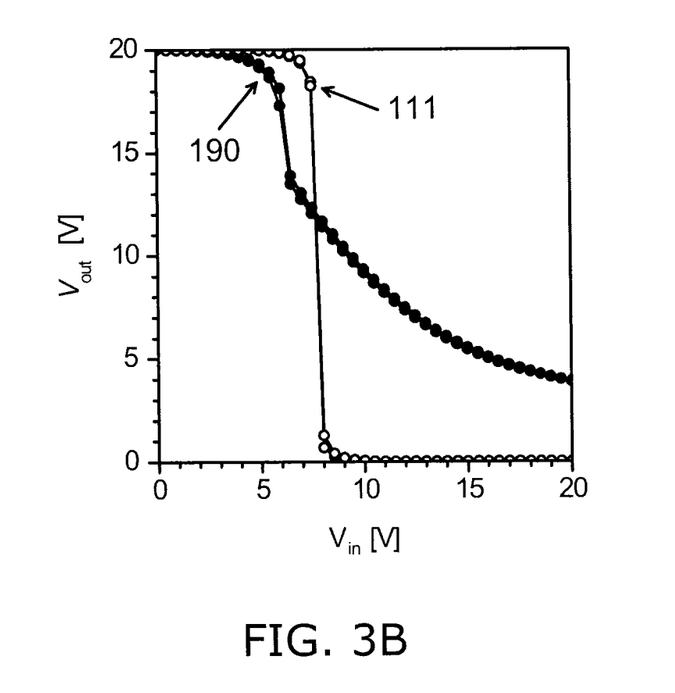

FIGS. 3A and 3B are diagrams illustrating a CMOS inverter.

FIG. 3A shows a circuit diagram of the CMOS inverter, and FIG. 3B shows the input/output characteristics of the CMOS inverter.

FIG. 3B shows the input/output characteristics of a CMOS inverter 190 according to a reference example in which the n-FET and p-FET of the CMOS inverter for the circuit shown in FIG. 3A are provided along the (0001) face (Si face), and it shows the input/output characteristics of a CMOS inverter 111 in which the n-FET is provided along (000-1) face (C face) and the p-FET is provided along (0001) face (Si face).

As illustrated in FIG. 3B, it can be understood that the CMOS inverter 111 in which the n-FET and p-FET are provided on mutually different crystal faces has favorable inverter characteristics compared to the CMOS inverter 190 in which the n-FET and p-FET are provided on the same crystal face.

Next, a method for manufacturing the semiconductor device 110 will be described.

Figure 4A:
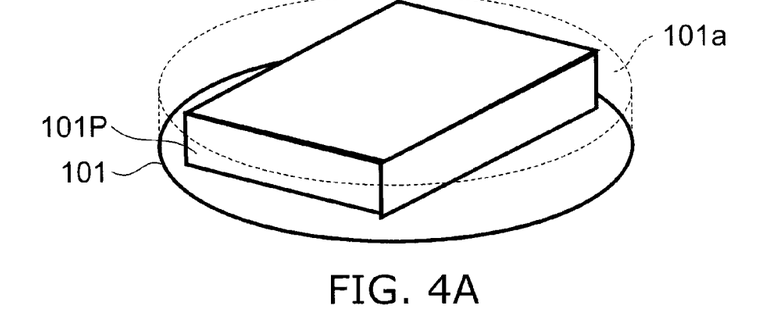
FIGS. 4A to 4C schematically illustrate an example of a method for manufacturing the semiconductor device.
Figure 4B:
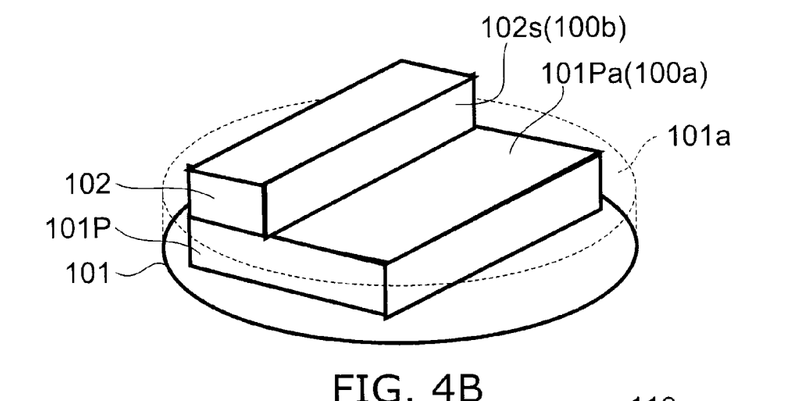
Figure 4C:
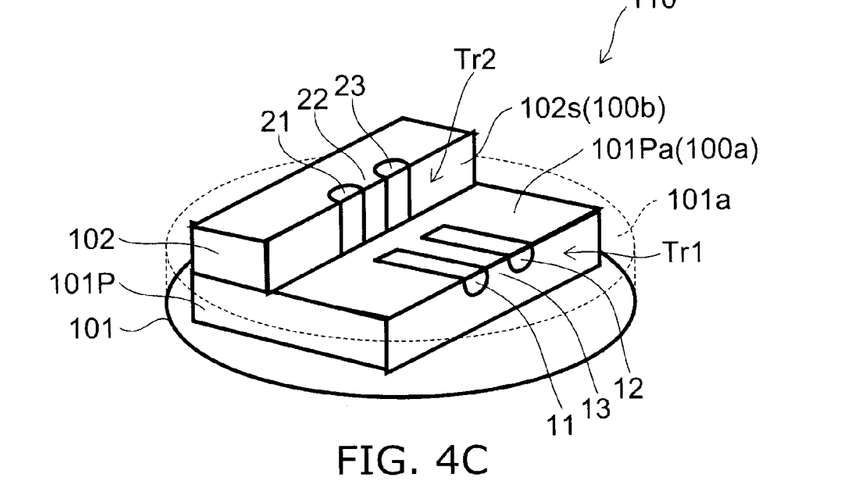

FIGS. 4A to 4C schematically illustrate an example of a method for manufacturing the semiconductor device.

Note that the broken lines shown in FIGS. 4A to 4C show a state prior to removing (etching or the like) a surface 101a of an SiC wafer 101.

First, an SiC wafer 101 is prepared as illustrated in FIG. 4A. The SiC crystal polymorph of the SiC wafer 101 is 4H. The surface 101a of the SiC wafer 101 is the (000-1) face.

Next, p-type impurities are implanted into a portion of the surface 101a of the SiC wafer 101 by photolithography and ion implantation processes. By this, a p-type region 101P is formed on the SiC wafer 101.

Next, as illustrated in FIG. 4B, the crystal layer 102 is formed using, for example, epitaxial growth, by introducing n-type impurities onto the surface 101a of the SiC wafer 101. Subsequently, a photolithography process is followed by an etching process to remove a portion of the crystal layer 102 to thereby expose the surface 101Pa of the p-type region 101P. The surface 101Pa is the first crystal face 100a.

Furthermore, removing a portion of the crystal layer 102 forms the side face 102s of the crystal layer 102. The side face 102s is the second crystal face 100b. The angle created by the side face 102s of the crystal layer 102 and the surface 101Pa of the p-type region 101P is not less than 72 degrees and not more than 98 degrees and is preferably close to 90 degrees. In addition, the side face 102s of the crystal layer 102 is preferably a face equivalent to the (11-20) face.

Next, as illustrated in FIG. 4C, n-type impurities are introduced onto a portion of the surface 101Pa of the p-type region 101P by photolithography and ion implantation processes. By this, the n-type source region 11 and the n-type drain region 12 are formed. The area between the source region 11 and the drain region 12 is where the p-type channel region 13 resides where n-type impurities have not been introduced.

In addition, p-type impurities are introduced onto a portion of the side face 102s of the crystal layer 102 by photolithography and ion implantation processes. The p-type impurities are introduced, for example, by oblique ion implantation onto the side face 102s. By this, the p-type source region 21 and the p-type drain region 22 are formed. The area between the source region 21 and the drain region 22 is where the n-type channel region 23 resides where p-type impurities have not been introduced.

After the n-type and p-type impurities have been introduced, a high temperature annealing process is performed to activate the impurities. Subsequent processes for gate insulating film deposition, gate electrode deposition, and electrode etching are performed to form the first field effect transistor Tr1 which is an n-FET on the surface 101Pa of the p-type region 101P, and to form the second field effect transistor Tr2 which is a p-FET on the side face 102s of the crystal layer 102. The semiconductor device 110 is completed after this manner.

Note that the semiconductor device 110 becomes a CMOS device with the continuity of the drain region 12 of the first field effect transistor Tr1 with the drain region 22 of the second field effect transistor Tr2. Further, a power device and a CMOS device may be embedded on the same SiC wafer 101 by, for example, creating a power MOSFET in a region other than in the region of the SiC wafer 101 where the CMOS device is created. The CMOS device may be used as a drive circuit and the like to control the embedded power device, or it may be used as an integrated circuit that functions on the SiC wafer 101 by configuring an arithmetic logic circuit or a high-speed memory circuit or the like.

Second Embodiment

Figure 5A:
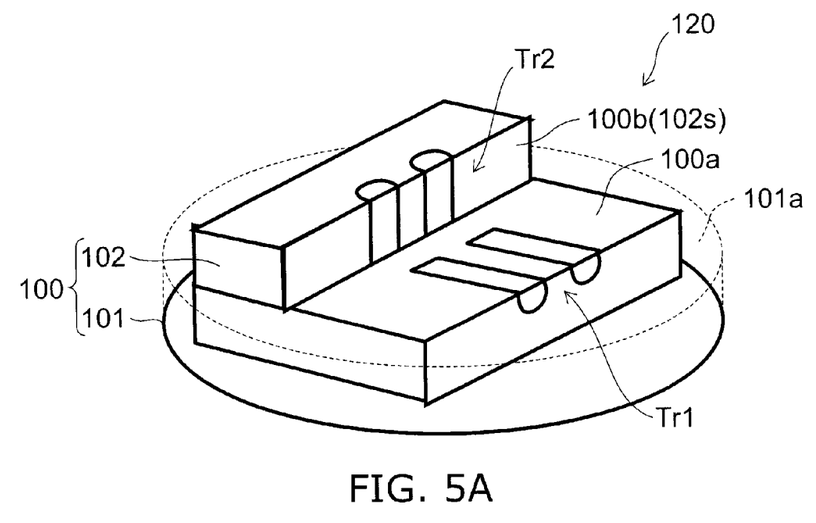
FIGS. 5A and 5B are schematic views illustrating examples of configurations of a semiconductor device according to a second embodiment.
Figure 5B:
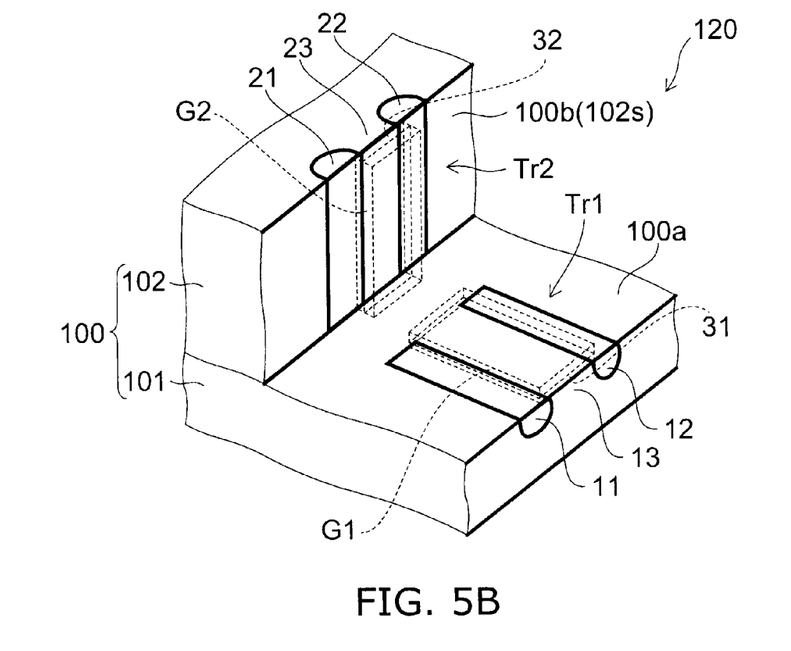

FIGS. 5A and 5B are schematic views illustrating examples of configurations of a semiconductor device according to a second embodiment.

FIG. 5A illustrates a schematic perspective view of a semiconductor device 120, and FIG. 5B schematically illustrates a layout of a transistor region. Note that the broken line shown in FIG. 5A shows a state prior to removing (etching or the like) the surface 101a of the SiC wafer 101.

As illustrated in FIG. 5A, the semiconductor device 120 according to the second embodiment differs in the orientation of the crystal face of the surface 101a of the SiC wafer 101 compared to the semiconductor device 110 according to the first embodiment.

In other words, in the semiconductor device 120, the first crystal face 100a of the silicon carbide region 100 which is a 4H-SiC is the (0001) face. When the surface 101a of the SiC wafer 101 is the first crystal face 100a, the crystal face of the surface of the SiC wafer 101 is the (0001) face. Note that the first crystal face 100a may be a surface of a layer of crystal that has grown on the surface 101a of the SiC wafer 101.

The crystal face of the second crystal face 100b of the silicon carbide region 100 in the semiconductor device 120 is the (11-20) face similar to the semiconductor device 110 according to the first embodiment. The second crystal face 100b may be a face equivalent to the (11-20) face.

As illustrated in FIG. 5B, the first field effect transistor Tr1 has an n-type (first conductivity type in the embodiment) source region (first region) 11, an n-type drain region (second region) 12, a p-type (second conductivity type in the embodiment) channel region (third region) 13 provided between the source region 11 and the drain region 12. Here, the source region 11, the drain region 12, and the channel region 13 are disposed along the first crystal face 100a.

A first gate insulating film (first insulating film) 31 is provided on top of the channel region 13, and a first gate electrode (first electrode) G1 is provided on top of the first gate insulating film 31. The first field effect transistor Tr1, when ON state, forms an n-type channel in the channel region 13. In other words, the first field effect transistor Tr1 is an n-FET. In the first field effect transistor Tr1, the channel is formed along the first crystal face 100a.

A second field effect transistor Tr2 has a p-type source region (fourth region) 21, a p-type drain region (fifth region) 22, and the n-type channel region (sixth region) 23 provided between the source region 21 and the drain region 22. The source region 21, the drain region 22, and the channel region 23 are disposed along the second crystal face 100b.

A second gate insulating film (second insulating film) 32 is provided on top of the channel region 23 and a second gate electrode (second electrode) G2 is provided on top of the second gate insulating film 32. The second field effect transistor Tr2, when ON state, forms a p-type channel in the channel region 23. In other words, the second field effect transistor Tr2 is a p-FET. In the first field effect transistor Tr2, the channel is formed along the second crystal face 100b.

In this manner, in the semiconductor device 120, the n-FET (the first field effect transistor Tr1) is provided along the (0001) face which is the first crystal face 100a, and the p-FET (the second field effect transistor Tr2) is provided along (11-20) face which is the second crystal face 100b. Disposing transistors having a conductivity type appropriate to the respective crystal face allows a sufficient level of performance to be achieved by the transistors having respective conductivity types in the semiconductor device 120 in which SiC is used.

The method for manufacturing the semiconductor device 120 is similar to the method for manufacturing the semiconductor device 110 according to the first embodiment. The method for manufacturing the semiconductor device 120 is similar to the method for manufacturing the semiconductor device 110 other than the use of the SiC wafer 101 in which the crystal face is the (0001) face.

In the semiconductor device 120, a similar circuit configuration to that of the semiconductor device 110 according to the first embodiment may be adopted. In other words, it becomes a CMOS device with the continuity of the drain region 12 of the first field effect transistor Tr1 with the drain region 15 of the second field effect transistor Tr2. Further, a power device and a CMOS device may be embedded on the same SiC wafer 101 by, for example, creating a power MOSFET in a region other than in the region of the SiC wafer 101 where the CMOS device is created. The CMOS device may be used as a drive circuit and the like to control the embedded power device, or it may be used as an integrated circuit that functions on the SiC wafer 101 by configuring arithmetic logic circuit or a high-speed memory circuit or the like.

In this manner, in the semiconductor device 120, an n-channel MOSFET (first field effect transistor Tr1) in which a channel is formed along the first crystal face 100a is provided and a p-channel MOSFET (second field effect transistor Tr2) in which a channel is formed along the second crystal face 100b is provided. Disposing transistors having a conductivity type appropriate to the respective crystal face allows a sufficient level of performance to be achieved by the transistors having respective conductivity types in the semiconductor device 120 in which SiC is used.

In the semiconductor device 120 according to the embodiment, in addition to a similar effect to that of the semiconductor device 110 according to the first embodiment, a beneficial effect is achieved in that mass production of a stable semiconductor device is possible because epitaxial growth on the Si face can be more stably performed than on the C face.

Third Embodiment

Figure 6A:
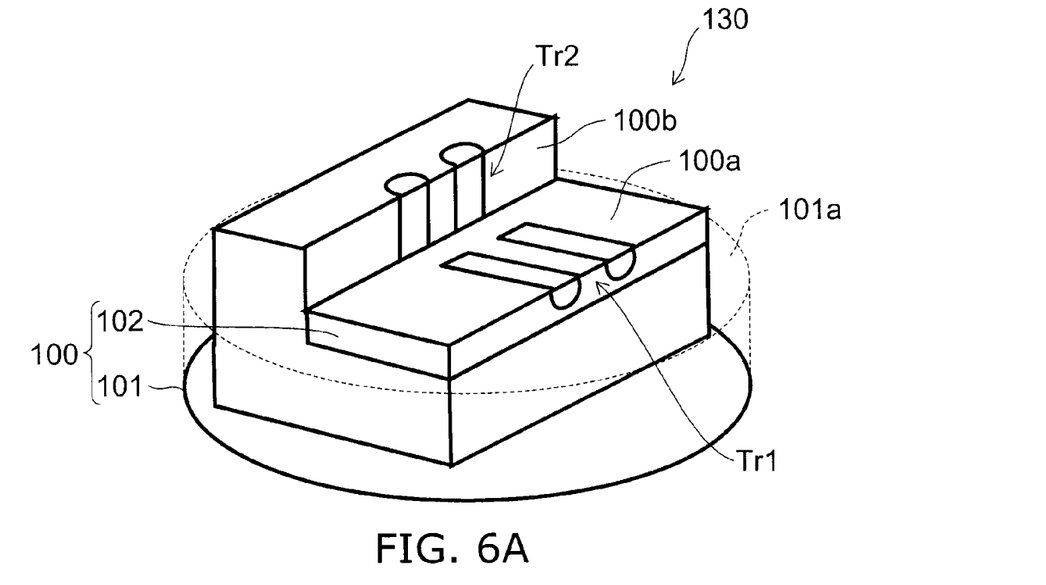
FIGS. 6A and 6B are schematic views illustrating examples of configurations of a semiconductor device according to a third embodiment.
Figure 6B:
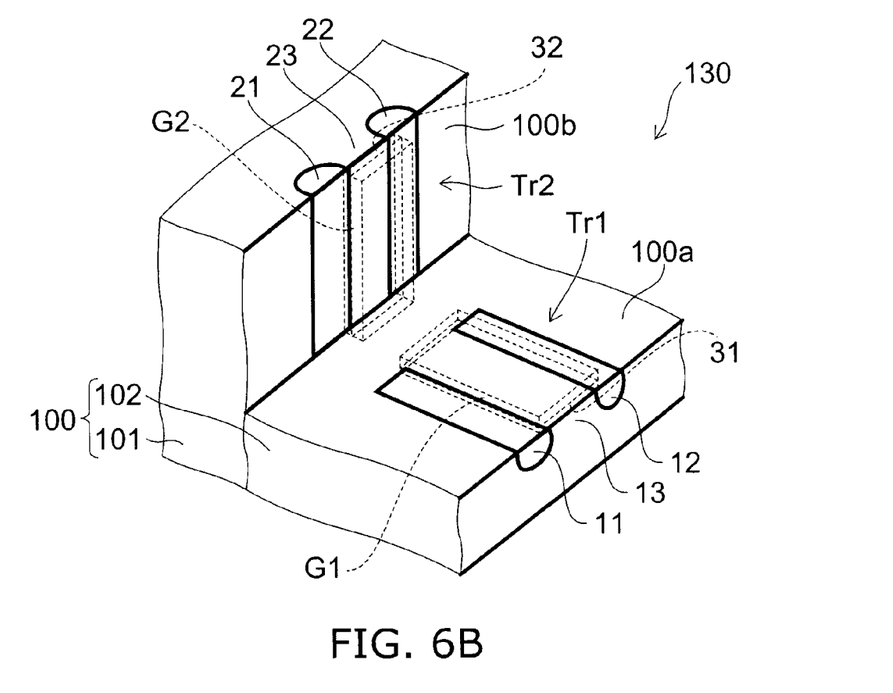

FIGS. 6A and 6B are schematic views illustrating examples of configurations of a semiconductor device according to a third embodiment.

FIG. 6A illustrates a schematic perspective view of a semiconductor device 130, and FIG. 6B schematically illustrates a layout of a transistor region. Note that the broken line shown in FIG. 6A shows a state prior to removing (etching or the like) the surface 101a of the SiC wafer 101.

As illustrated in FIG. 6A, the semiconductor device 130 according to the second embodiment differs in the orientation of the crystal face of the surface 101a of the SiC wafer 101 compared to the semiconductor device 110 according to the first embodiment and the semiconductor device 120 according to the second embodiment.

In other words, in the semiconductor device 130, the first crystal face 100a of the silicon carbide region 100 which is a 4H-SiC is the (0001) face. When the surface 101a of the SiC wafer 101 is the first crystal face 100a, the crystal face of the surface of the SiC wafer 101 is the (0001) face. Note that the first crystal face 100a may be a surface of a layer of crystal that has grown on the surface 101a of the SiC wafer 101.

The crystal face of the second crystal face 100b of the silicon carbide region 100 in the semiconductor device 130 is the (11-20) face similar to the semiconductor device 110 according to the first embodiment. Note that the second crystal face 100a may be a surface (side face) of a layer of crystal that has grown on the surface 101a of the SiC wafer 101a.

As illustrated in FIG. 6B, the first field effect transistor Tr1 has a p-type (first conductivity type in the embodiment) source region (first region) 11, a p-type drain region (second region) 12, and an n-type (second conductivity type in the embodiment) channel region (third region) 13 provided between the source region 11 and the drain region 12. Here, the source region 11, the drain region 12, and the channel region 13 are disposed along the first crystal face 100a.

A first gate insulating film (first insulating film) 31 is provided on top of the channel region 13, and a first gate electrode (first electrode) G1 is provided on top of the first gate insulating film 31. The first field effect transistor Tr1, when ON state, forms a p-type channel in the channel region 13. In other words, the first field effect transistor Tr1 is a p-FET. In the first field effect transistor Tr1, the channel is formed along the first crystal face 100a.

The second field effect transistor Tr2 has an n-type source region (fourth region) 21, an n-type drain region (fifth region) 22, and a p-type channel region (sixth region) 23 provided between the source region 21 and the drain region 22. The source region 21, the drain region 22, and the channel region 23 are disposed along the second crystal face 100b.

A second gate insulating film (second insulating film) 32 is provided on top of the channel region 23 and a second gate electrode (second electrode) G2 is provided on top of the second gate insulating film 32. The second field effect transistor Tr2, when ON state, forms an n-type channel in the channel region 23. In other words, the second field effect transistor Tr2 is an n-FET. In the first field effect transistor Tr2, the channel is formed along the second crystal face 100b.

In this manner, the semiconductor device 130 is provided with a p-FET (the first field effect transistor Tr1) where a channel is formed along the (0001) face which is the first crystal face 100a, and is provided with an n-FET (the second field effect transistor Tr2) where a channel is formed along the (11-20) face which is the second crystal face 100b. Disposing transistors having a conductivity type appropriate to the respective crystal face allows a sufficient level of performance to be achieved by the transistors having respective conductivity types in the semiconductor device 130 in which SiC is used.

In the semiconductor device 130 according to the embodiment, in addition to a similar effect to that of the semiconductor device 110 according to the first embodiment, a beneficial effect is achieved in that mass production of a stable semiconductor device is possible because epitaxial growth on the Si face can be more stably performed on the C face.

Next, a method for manufacturing the semiconductor device 130 will be described.

Figure 7A:
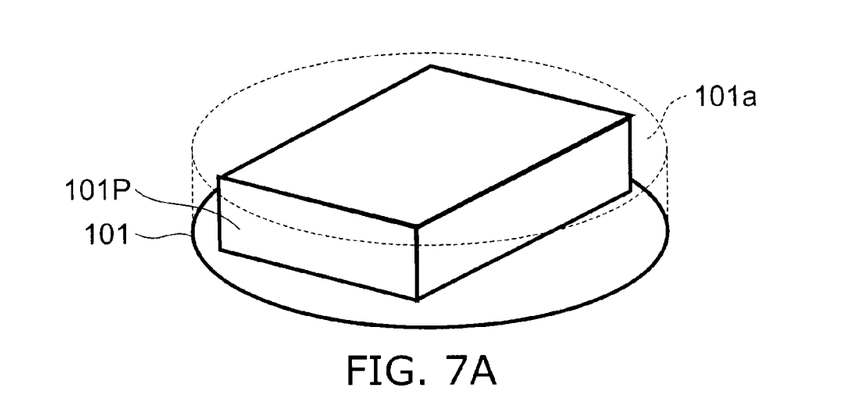
FIGS. 7A to 7C schematically illustrate an example of a method for manufacturing the semiconductor device.
Figure 7B:
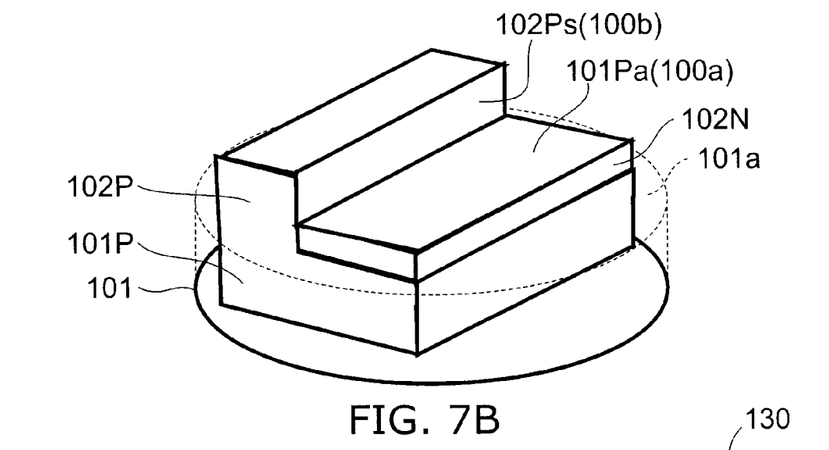
Figure 7C:
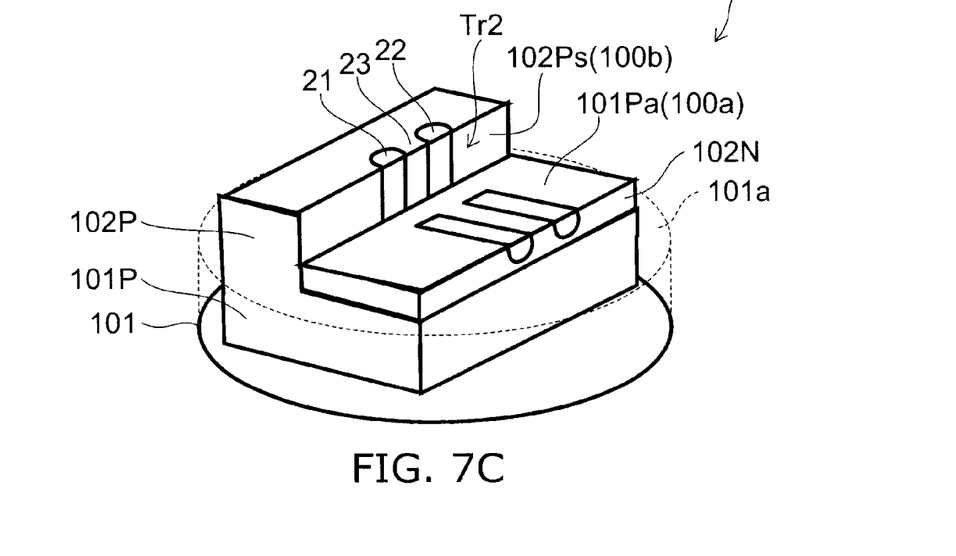

FIGS. 7A to 7C schematically illustrate an example of a method for manufacturing the semiconductor device.

Note that the broken line shown in FIGS. 7A to 7C shows a state prior to removing (etching or the like) the surface 101a of the SiC wafer 101. First, an SiC wafer 101 is prepared as illustrated in FIG. 7A. The SiC crystal polymorph of the SiC wafer 101 is 4H. The surface 101a of the SiC wafer 101 is the (0001) face.

Next, p-type impurities are implanted into a portion of the surface 101a of the SiC wafer 101 by photolithography and ion implantation processes. By this, a p-type region 101P is formed on the SiC wafer 101.

Next, as illustrated in FIG. 7B, a p-type crystal layer 102P is formed using, for example, epitaxial growth, by introducing p-type impurities onto the surface 101a of the SiC wafer 101. Subsequently, a photolithography process is followed by an etching process to remove a portion of the p-type crystal layer 102P. The thickness of the p-type crystal layer 102P that is removed by the etching process is preferred to be thinner than the overall thickness of the p-type crystal layer 102P.

A side face 102Ps of the p-type crystal layer 102P that is exposed by the etching process is the second crystal face 100b. Further, a surface 102Pa of the p-type crystal layer 102P that is exposed by the etching process is the first crystal face 100a. The angle created by the side face 102Ps of the p-type crystal layer 102P and the surface 102Pa of the p-type region 102P is not less than 72 degrees and not more than 98 degrees and is preferably close to 90°. In addition, the side face 102Ps of the p-type crystal layer 102P is preferably a face equivalent to the (11-20) face.

Next, n-type impurities are introduced onto the surface 102Pa of the p-type crystal layer 102P adjacent to the side face 102Ps by photolithography and ion implantation processes. By this, an n-type region 102N is formed.

Next, as illustrated in FIG. 7C, p-type impurities are introduced onto a portion of the surface of the n-type region 102N by photolithography and ion implantation processes. By this, the p-type source region 11 and the p-type drain region 12 are formed. The area between the source region 11 and the drain region 12 is where the n-type channel region 13 resides where p-type impurities have not been introduced.

In addition, n-type impurities are introduced onto a portion of the side face 102Ps of the p-type crystal layer 102P by photolithography and ion implantation processes. The n-type impurities are introduced, for example, by oblique ion implantation onto the side face 102Ps. By this, an n-type source region 14 and an n-type drain region 15 are formed. The area between the source region 14 and the drain region 15 is where the p-type channel region 16 resides where n-type impurities have not been introduced.

After the n-type and p-type impurities have been introduced, a high temperature annealing process is begun to activate the impurities. Subsequent process for gate insulating film deposition, gate electrode deposition, and electrode etching are performed to form the first field effect transistor Tr1 which is a p-FET on the surface of the n-type region 102N, and to form the second field effect transistor Tr2 which is an n-FET on the side face 102Ps of the p-type crystal layer 102P. The semiconductor device 130 is completed after this manner.

In the semiconductor device 130, a similar circuit configuration to that of the semiconductor device 110 according to the first embodiment or to that of the semiconductor device 120 according to the second embodiment may be adopted. In other words, it becomes a CMOS device with the continuity of the drain region 12 of the first field effect transistor Tr1 with the drain region 15 of the second field effect transistor Tr2. Further, a power device and a CMOS device may be embedded on the same SiC wafer 101 by, for example, creating a power MOSFET in a region other than in the region of the SiC wafer 101 where the CMOS device is created. The CMOS device may be used as a drive circuit and the like to control the embedded power device, or it may be used as an integrated circuit that functions on the SiC wafer 101 by configuring arithmetic logic circuit or a high-speed memory circuit or the like.

Fourth Embodiment

Figure 8:
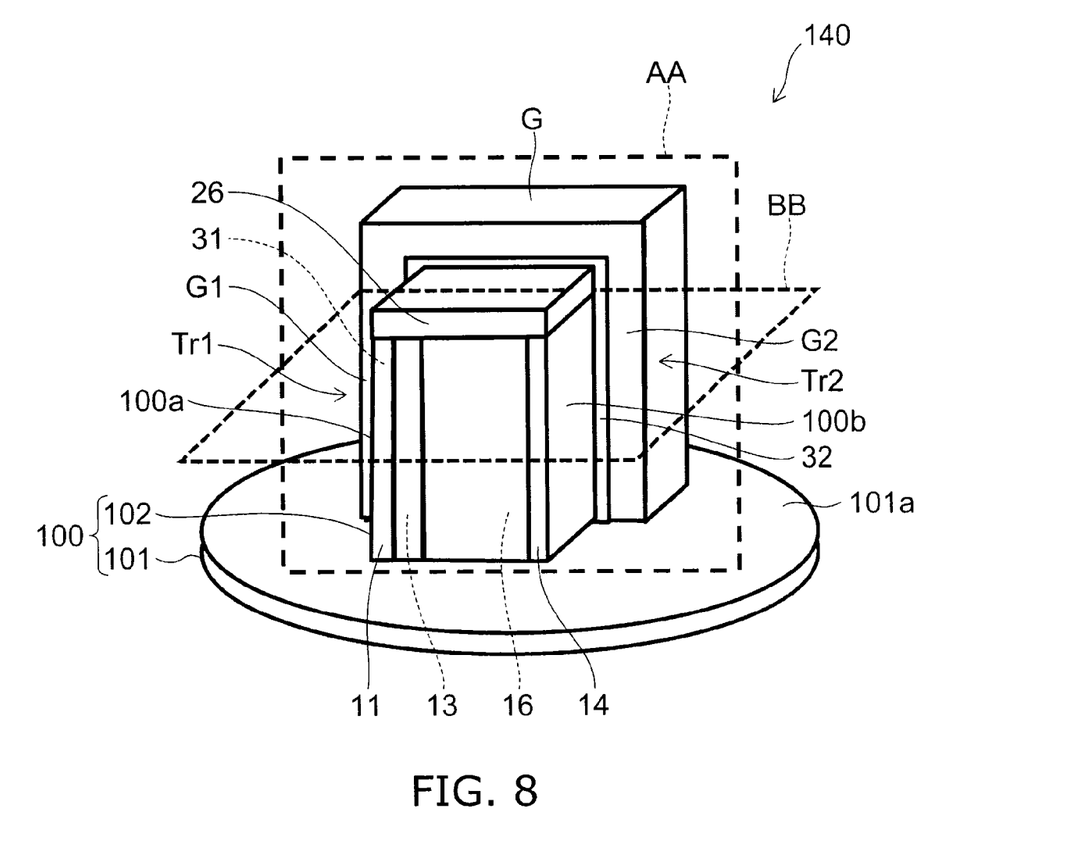
FIG. 8 is a schematic view illustrating an example of a configuration of a semiconductor device according to a fourth embodiment.

FIG. 8 is a schematic view illustrating an example of a configuration of a semiconductor device according to a fourth embodiment.

Figure 9A:
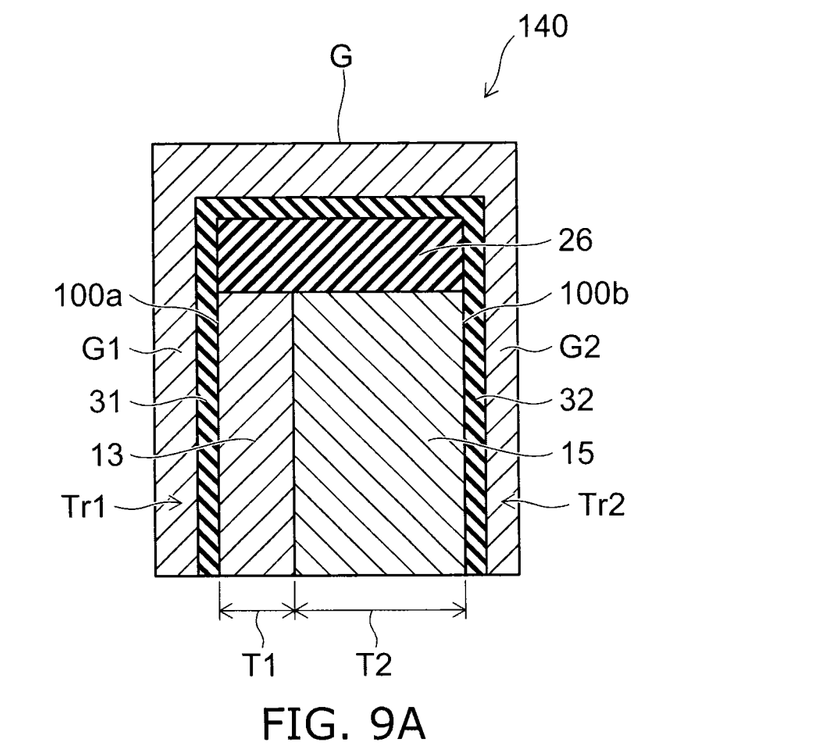
FIGS. 9A and 9B are schematic cross-sectional views illustrating examples of a configuration of a semiconductor device according to the fourth embodiment.
Figure 9B:
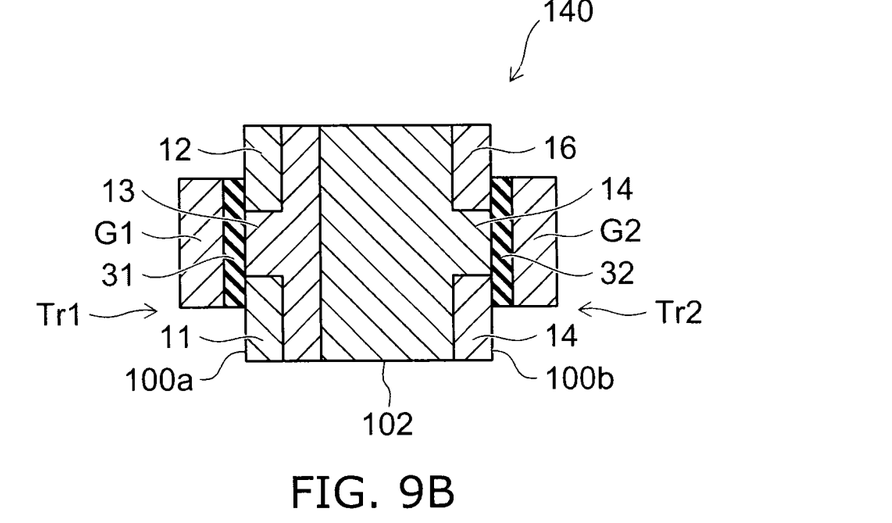

FIGS. 9A and 9B are schematic cross-sectional views illustrating examples of a configuration of a semiconductor device according to the fourth embodiment.

FIG. 9A illustrates a cross-sectional view of the AA plane illustrated in FIG. 8, and FIG. 9B illustrates a cross-sectional view of the BB plane illustrated in FIG. 8.

As illustrated in FIG. 8, the semiconductor device 140 according to the fourth embodiment differs in that the first crystal face 100a and the second crystal face 100b are mutually parallel compared to the semiconductor device 110 according to the first embodiment.

In the semiconductor device 140, the first crystal face 100a of the silicon carbide region 100 which is a 4H-SiC is the (000-1) face, and the second crystal face 100b is the (0001) face. Note that the first crystal face 100a may be a face equivalent to the (000-1). Note that the second crystal face 100b may be a face equivalent to (0001).

The silicon carbide region 100 includes a crystal layer 102 provided on, for example, an SiC wafer (substrate) 101 and an SiC wafer 101. The surface (first face) 101a of the SiC wafer 101 is either the (11-20) face or the (1-100) face. The crystal layer 102 has a plurality of side faces 102s that are orthogonal to the surface 101a of the SiC wafer 101. One of the plurality of side faces 102s is the first crystal face 100a, and another one is the second crystal face 100b.

As illustrated in FIGS. 8 and 9B, the first field effect transistor Tr1 has an n-type (first conductivity type in the embodiment) source region (first region) 11, an n-type drain region (second region) 12, a p-type (second conductivity type in the embodiment) channel region (third region) 13 provided between the source region 11 and the drain region 12. Here, the source region 11, the drain region 12, and the channel region 13 are disposed along the first crystal face 100a.

A first gate insulating film (first insulating film) 31 is provided on top of the channel region 13, and a first gate electrode (first electrode) G1 is provided on top of the first gate insulating film 31. The first field effect transistor Tr1, when ON state, forms an n-type channel in the channel region 13. In other words, the first field effect transistor Tr1 is an n-FET. In the first field effect transistor Tr1, the channel is formed along the first crystal face 100a.

The second field effect transistor Tr2 has a p-type source region (fourth region) 21, a p-type (second conductivity type) drain region (fifth region) 22, and an n-type channel region (sixth region) 23 provided between the source region 21 and the drain region 22. The source region 21, the drain region 22, and the channel region 23 are disposed along the second crystal face 100b.

A second gate insulating film (second insulating film) 32 is provided on top of the channel region 23, and a second gate electrode (second electrode) G2 is provided on top of the second gate insulating film 32. The second field effect transistor Tr2, when ON state, forms a p-type channel in the channel region 23. In other words, the second field effect transistor Tr2 is a p-FET. In the first field effect transistor Tr2, the channel is formed along the second crystal face 100b.

In this manner, in the semiconductor device 140, the n-FET (the first field effect transistor Tr1) is provided along the (000-1) face which is the first crystal face 100a, and the p-FET (the second field effect transistor Tr2) is provided along (0001) face which is the second crystal face 100b. Disposing transistors having a conductivity type appropriate to the respective crystal face allows a sufficient level of performance to be achieved by the transistors having respective conductivity types in the semiconductor device 140 in which SiC is used.

As illustrated in FIG. 9A, in the semiconductor device 140, the length (thickness) t2 of the n-type channel region 23 in a direction parallel to the surface 101a is greater than the length (thickness) t1 of the p-type channel region 13 in a direction parallel to the surface 101a. As described above, the p-FET has a carrier mobility that is lower than that of the n-FET. Accordingly, because the length t2 of the channel region 23 is greater than the length t1 of the channel region 13 the difference in carrier mobilities between the p-FET and the n-FET can be adjusted.

Further, the first gate electrode G1 is integrally provided with a second gate electrode G2. In other words, the gate electrode G is formed so as to cover the side face 102s and the top face 102a of the crystal layer 102. Of the gate electrodes G, that opposing the first channel region 13 having the first gate insulating film 31 therebetween is the first gate electrode G1, and that opposing the second channel region 23 having the second gate insulating film 32 therebetween is the second gate electrode G2.

In the semiconductor device 140 according to the embodiment, transistor characteristics of respective conductivity types can be sufficiently demonstrated by using the relationship between the crystal face of the SiC and the characteristics of an n-FET and a p-FET as described above. By this, the characteristics of the semiconductor device 110 are improved when providing transistors having different conductivity types when using SiC.

Further, in the semiconductor device 140, the directions of the respective channel widths of the n-FET and the p-FET are directions that are orthogonal to the surface 101a of the SiC wafer 101. Accordingly, the occupied area of the device is reduced compared to when provided along the surface 101a of the SiC wafer 101 in the directions of the respective channel widths of the n-FET and the p-FET.

Next, a method for manufacturing the semiconductor device 140 will be described.

First, an SiC wafer 101 is prepared as illustrated in FIG. 8. The SiC crystal polymorph of the SiC wafer 101 is 4H. The surface 101a of the SiC wafer 101 is either the (11-20) face or the (1-100) face. N-type impurities are introduced to the SiC wafer 101.

Next, a portion of the surface 101a of the SiC wafer 101 is removed by photolithography and ion implantation processes to form an SiC projection portion 102t. The projection portion 102t is equivalent to the crystal layer 102. The projection portion 102t is provided in the shape of a fin that extends along the surface 101a. Note that in place of forming the projection portion 102t, the crystal layer 102 may be formed using, for example, epitaxial growth, by introducing an n-type impurities onto the surface 101a of the SiC wafer 101. One of the plurality of side faces of the projection portion 102t is the first crystal face 100a, and another two are the second crystal faces 100b.

Next, after photolithography has completed, n-type impurities are introduced onto a portion of the first crystal face 100a by ion implantation having an oblique incidence angle. By this, the n-type source region 11 and the n-type drain region 12 are formed. The area between the source region 11 and the drain region 12 is where the p-type channel region 13 resides where n-type impurities have not been introduced.

Next, n-type impurities are introduced onto a portion of the first crystal face 100a by ion implantation having an oblique incidence angle. By this, the p-type source region 21 and the p-type drain region 22 are formed. The area between the source region 21 and the drain region 22 is where the n-type channel region 23 resides where p-type impurities have not been introduced.

After the n-type and p-type impurities have been introduced, a high temperature annealing process is performed to activate the impurities.

Next, after depositing an SiN layer thicker than the height of the fin shaped projection portion 102t on the entire surface of the SiC wafer 101 using, for example, a chemical vapor deposition (CVD) method, the SiN layer is polished by a chemical mechanical polishing (CMP) process to expose the top portion of the fin shaped projection portion 102t.

Next, an $SiO_2$ film is formed on the top portion of the projection portion 102t exposed by a thermal oxidation process. Subsequently, the SiN layer is selectively removed chemically. By this, an insulating film 26 of $SiO_2$ is provided on the top portion of the projection portion 102t. The insulating film 26 functions to provide element isolation between the first field effect transistor Tr1 and the second field effect transistor Tr2.

Subsequent processes for gate insulating film deposition, gate electrode deposition, and electrode etching are performed to form the gate electrodes G. By this, the first field effect transistor Tr1, which is an n-FET, is provided on the first crystal face 100a which is one side face 102s of the projection portion 102t, and the second field effect transistor Tr2, which is a p-FET, is provided on the second crystal face 100b which is another side face 102s of the projection portion 102t. The semiconductor device 140 is completed after this manner.

The semiconductor device 140 becomes a CMOS device with the continuity of the drain region 12 of the first field effect transistor Tr1 with the drain region 15 of the second field effect transistor Tr2. Further, a power device and a CMOS device may be embedded on the same SiC wafer 101 by, for example, creating a power MOSFET in a region other than in the region of the SiC wafer 101 where the CMOS device is created. The CMOS device may be used as a drive circuit and the like to control the embedded power device, or it may be used as an integrated circuit that functions on the SiC wafer 101 by configuring an arithmetic logic circuit or a high-speed memory circuit or the like.

As described above, the semiconductor device according to the embodiment can improve the switching characteristics of a semiconductor device in which SiC is used.

Note also that although embodiments and variations have been described above, the invention is not limited to these. For example, configurations of the above described embodiments or variations which have been added to, removed from, or changed in design in a way that could be easily arrived at by a person skilled in the art, and any appropriate combination of the characteristics of the embodiments is to be construed as being within the scope of the invention.

In addition, although a MOSFET was used as an example of the transistor in the embodiment, it also can be applied to a bipolar transistor. Further, in addition to transistors, it can also be applied to diodes. Furthermore, although transistors having appropriate conductivity types for the first crystal face 100a and the second crystal face 100b, respectively, are provided in the semiconductor devices 110, 120, 130, and 140, transistors having appropriate conductivity types for three or more different crystal faces may also be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first transistor including a first region of a first conductivity type, a second region of the first conductivity type and a third region of a second conductivity type, the first region being disposed along a first crystal face of a silicon carbide region, the silicon carbide region having the first crystal face and a second crystal face having a different plane orientation from the plane orientation of the first crystal face, the second region being disposed along the first crystal face, and the third region being provided between the first region and the second region, the third region being disposed along the first crystal face;
a second transistor including a fourth region of the second conductivity type, a fifth region of the second conductivity type and a sixth region of the first conductivity type, the fourth region being disposed along the second crystal face of the silicon carbide region, the fifth region being disposed along the second crystal face, and the sixth region being provided between the fourth region and the fifth region, the sixth region being disposed along the second crystal face,
a substrate having a first face; and
a crystal layer provided on the first face of the substrate, the crystal layer having a second face orthogonal to the first face,
the first crystal face being the first face, and
the second crystal face being the second face.

2. The semiconductor device according to claim 1, wherein the first crystal face is orthogonal to the second crystal face.

3. The semiconductor device according to claim 1, wherein the first crystal face is a (000-1) face.

4. The semiconductor device according to claim 3, wherein the first conductivity type is n-type, and the second conductivity type is p-type.

5. The semiconductor device according to claim 1, wherein the first crystal face is a (0001) face.

6. The semiconductor device according to claim 5, wherein the first conductivity type is n-type, and the second conductivity type is p-type.

7. The semiconductor device according to claim 5, wherein the first conductivity type is p-type, and the second conductivity type is n-type.

8. The semiconductor device according to claim 5, wherein the second crystal face is a (11-20) face.

9. The semiconductor device according to claim 1, wherein the first transistor includes a first insulating film provided on the third region and a first electrode provided on the first insulating film, and
the second transistor includes a second insulating film provided on the sixth region and a second electrode provided on the second insulating film.

10. The semiconductor device according to claim 1, wherein the second region has continuity with the fifth region.

11. The semiconductor device according to claim 1, wherein a crystal polymorph of the silicon carbide region is 4H.

12. The semiconductor device according to claim 1, wherein the crystal layer is formed by crystal growth on the first face.

13. The semiconductor device according to claim 1, wherein the first crystal face is a (000-1) face.

14. The semiconductor device according to claim 1, wherein
the first conductivity type is n-type, and
the second conductivity type is p-type.

15. A semiconductor device comprising:
a first transistor including a first region of a first conductivity type, a second region of the first conductivity type and a third region of a second conductivity type, the first region being disposed along a first crystal face of a silicon carbide region, the silicon carbide region having the first crystal face and a second crystal face having a different plane orientation from the plane orientation of the first crystal face, the second region being disposed along the first crystal face, and the third region being provided between the first region and the second region, the third region being disposed along the first crystal face;
a second transistor including a fourth region of the second conductivity type, a fifth region of the second conductivity type and a sixth region of the first conductivity type, the fourth region being disposed along the second crystal face of the silicon carbide region, the fifth region being disposed along the second crystal face, and the sixth region being provided between the fourth region and the fifth region, the sixth region being disposed along the second crystal face,
a substrate having a first face; and
a crystal layer provided on the first face of the substrate, the crystal layer having a second face and a third face, the second face being orthogonal to the first face, the third face being parallel to the first face and orthogonal to the second face,
the first crystal face being the second face, and
the second crystal face being the third face.

16. The semiconductor device according to claim 15, wherein
the first crystal face is a (000-1) face, and
the second crystal face is a (0001) face.

17. The semiconductor device according to claim 15, wherein
the first conductivity type is n-type, and
the second conductivity type is p-type.

* * * * *